United States Patent [19]
Takahashi

[11] Patent Number: 6,022,803
[45] Date of Patent: Feb. 8, 2000

[54] FABRICATION METHOD FOR SEMICONDUCTOR APPARATUS

[75] Inventor: Kiyoshi Takahashi, Tokyo, Japan

[73] Assignee: NEC Corporation, Tokyo, Japan

[21] Appl. No.: 08/806,777

[22] Filed: Feb. 26, 1997

[51] Int. Cl.[7] .................................................. H01L 21/027
[52] U.S. Cl. ........................ 438/670; 438/694; 438/710; 438/713; 216/39; 216/40; 216/67; 216/70; 118/723 EB
[58] Field of Search ................................ 118/723 EB, 56, 118/58; 216/12, 39, 40, 58, 70, 75; 438/584, 597, 599, 662, 669, 670, 672, 673, 679, 683

[56] References Cited

U.S. PATENT DOCUMENTS

| | | | |
|---|---|---|---|
| 3,822,467 | 7/1974 | Symersky | 438/656 |
| 5,340,773 | 8/1994 | Yamamoto | 438/653 |
| 5,618,754 | 4/1997 | Kasahara | 438/653 |

FOREIGN PATENT DOCUMENTS 63-292630  11/1988  Japan .

OTHER PUBLICATIONS

Hirano et al., "Folded U–Shaped Micro–Wire Technology for GaAs ICs", *The Inst. of Elec., Info., and Communication Engineers of Japan*, Dec. 1992 Autumn Conference Report Separate Issue 2, p. 2–420.

*Primary Examiner*—Randy Gulakowski
*Assistant Examiner*—Allan Olsen
*Attorney, Agent, or Firm*—Sughrue, Mion, Zinn, MacPeak & Seas, PLLC

[57] ABSTRACT

In a fabrication method of a semiconductor apparatus, the semiconductor apparatus is made with a selective gold plating process rather than an ion-milling process. A tungsten film (W film) as a current supplying layer is formed on the entire front surface of an insulation film. The insulation film is formed on a GaAs substrate on which devices such as FETs are formed. With a mask of a photoresist film, a titanium (Ti) film, a platinum (Pt) film, and a gold (Au) film are successively evaporated and then lift-off process is performed. A photoresist film is patterned. A gold plate film with a thickness of 8 μm is formed. The current supplying layer is removed by magnetron discharge plasma ion-etching process. Thick U-shaped gold plate lines are formed.

8 Claims, 5 Drawing Sheets

FIG.1(a)
2:INSULATION FILM
1:GaAs SUBSTRATE

FIG.1(b)
14:TUNGSTEN FILM

FIG.1(c)
4A:PLATINUM FILM
3A:TITANIUM FILM
16:PHOTORESIST FILM

FIG.1(d)
7A:GOLD PLATE FILM
6A:PHOTORESIST FILM

FIG.1(e)
8A:GOLD LINE

PRIOR ART

FIG.4(a)

2: INSULATION FILM
1: GaAs SUBSTRATE

FIG.4(b)

4: PLATINUM FILM
3: TITANIUM FILM

FIG.4(c)

7: GOLD PLATE FILM
6: PHOTORESIST FILM

8: GOLD LINE

PRIOR ART

FIG. 5(a)

9: PHOTORESIST FILM

FIG. 5(b)

10: CURRENT SUPPLYING LAYER

FIG. 5(c)

11: GOLD PLATE FILM

FIG. 5(d)

12: PHOTORESIST FILM

FIG. 5(e)

13: U-SHAPED GOLD LINE

6,022,803

FABRICATION METHOD FOR SEMICONDUCTOR APPARATUS

BACKGROUND OF THE INVENTION (1) Field of the Invention

The present invention relates to a fabrication method for a semiconductor apparatus, in particular, to a method for forming gold lines.

(2) Description of the Prior Art

In conventional integrated circuits composed of GaAs compound semiconductor devices or the like, gold is preferably used because it has a low resistance and a migration resistance characteristic. When gold lines are formed, since the deposition rate of the sputtering method or the like is low, in order to form thick films on the level of 1 μm, a plating method has been widely used.

Conventionally, gold lines are formed step by step in the following manner (referred to as a first prior art reference).

Figure 4A:
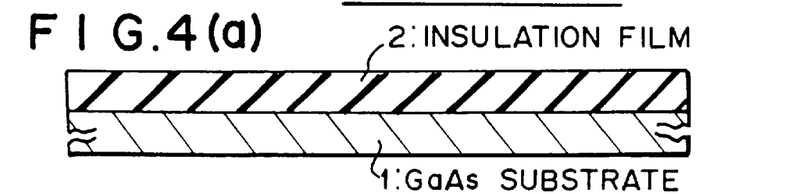
FIGS. 4(a) to 4(e) are sectional views showing fabrication steps (a) to (e) for explaining a first prior art reference.
Figure 4B:
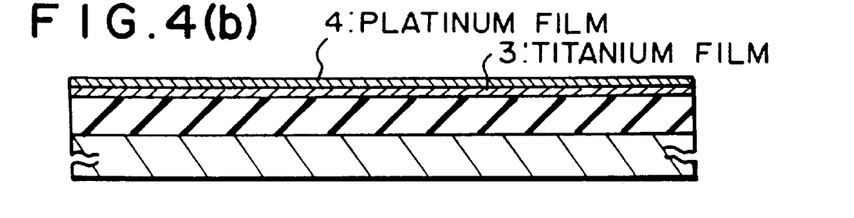
Figure 4C:
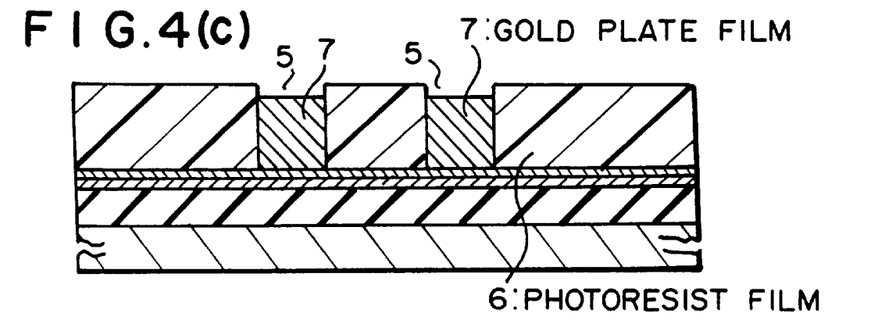
Figure 4D:
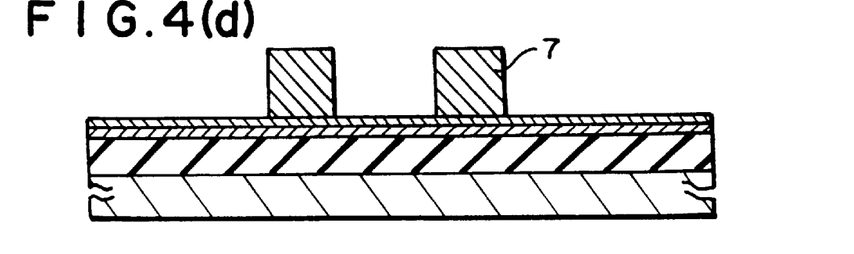
Figure 4E:
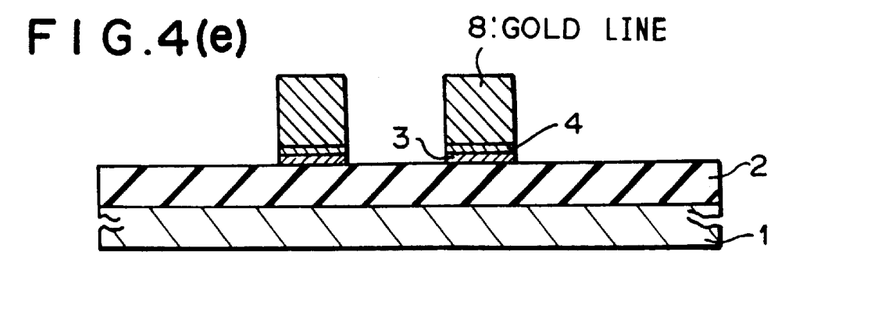

As shown in FIG. 4(a), a base substrate of which an insulation film 2 with connection holes such as contact holes (not shown) are formed on the front surface of a base substrate such as a substrate 1 is prepared. As shown in FIG. 4(b), a titanium film 3 with a thickness of for example 100 nm and a platinum film 4 with a thickness of for example 100 nm are deposited by evaporating process or sputtering process. As shown in FIG. 4(c), a photoresist film 6 with openings 5 in a predetermined pattern is formed. With a current supplying layer of the platinum film 4 and the titanium film 3, a gold plate film 7 with a thickness of for example 1 μm is formed. As shown in FIG. 4(d), the photoresist film 6 is removed. The two-layered films that are not coated with the gold plate film 7 are removed. Thereby, gold lines 8 are formed.

When such integrated circuits are used in a high frequency region, the most important point to be considered as lines is a current loss due to a high frequency current. In other words, when an electromagnetic wave propagates through lines, a current flows near the surface of each line. In other words, skin effect takes place. As the frequency increases, the thickness of the surface in which the current flow decreases. However, the resistance per unit length of each line is inversely proportional to the sectional area of the portion in which the current flows. Thus, as the frequency increases, the resistance increases. Thereby, the current loss increases. Thus, when lines with a rectangular section are used even if the resistance of the material thereof is low, the current loss becomes large. To solve this problem, the thickness of the plate is increased so as to increases the surface area of the lines. In addition, the section of each line is formed in a U shape (hereinafter, referred to as U-shaped gold line). This method was proposed in "1992 Autumn Conference Report Separate Issue 2", page 420, The Institute of Electronics, Information, and Communication Engineers of Japan.

Figure 5A:
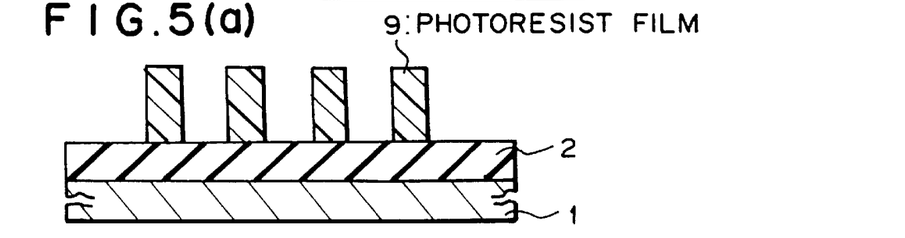
FIGS. 5(a) to (e) are sectional views showing fabrication steps (a) to (e) for explaining a second prior art reference.
Figure 5B:
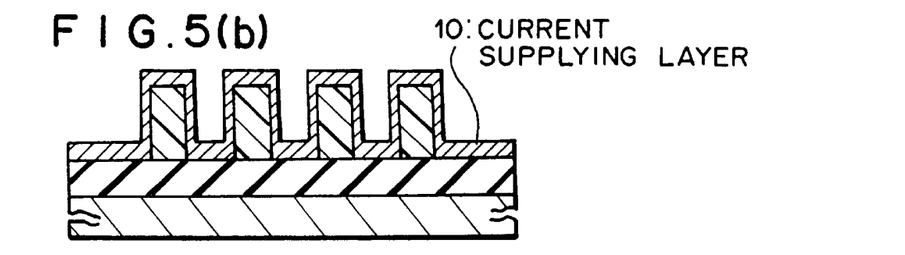
Figure 5C:
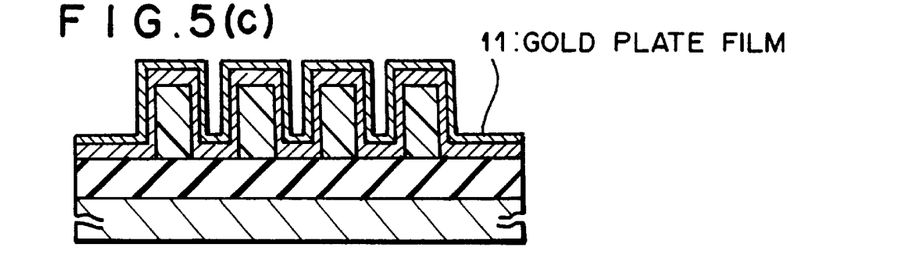
Figure 5D:
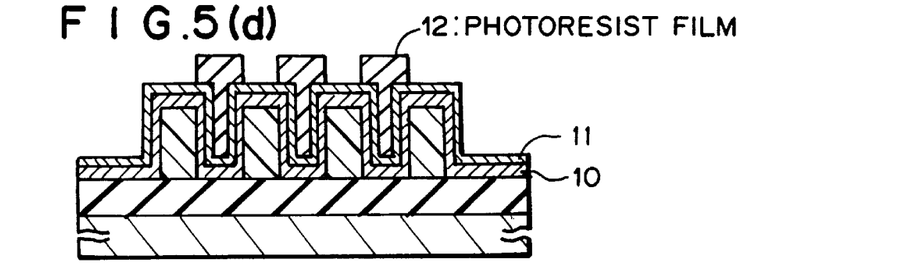
Figure 5E:
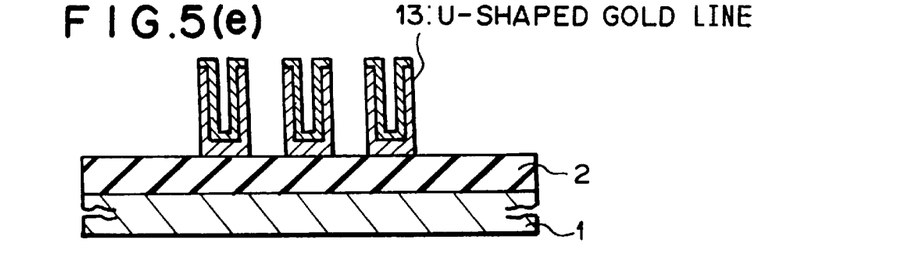

Next, the method for forming U-shaped gold lines will be described as a second prior art reference. As shown in FIG. 5(a), a photoresist film 9 with a thickness of for example 10 μm is formed at a predetermined portion of an insulation film 2 (having connection holes such as contact holes (not shown)) on a semiconductor substrate such as a GaAs substrate 1 by the known photolithography technology. Next, as shown in FIG. 5(b), by the sputtering method, a metal film as a current supplying layer 10 is formed on the entire front surface. As shown in FIG. 5(c), a gold plate film 11 with a thickness of 1 μm is formed. Thereafter, as shown in FIG. 5(d), a photoresist film 12 as a mask material is formed at a portion where lines are formed. The current supplying layer of the gold plate film is removed from non-line portions by the ion-milling process. Finally, the photoresist films 12 and 9 are peeled off. Thereby, as shown in FIG. 5(e), U-shaped gold lines 13 are formed.

According to the first and second prior art references, since metal films are removed by the ion-milling method, the metal particles which were removed from the ground substrate by the ion-milling method tend to re-adhere to the inside of the ion-milling unit. Thus, a first problem is that it is difficult to clean the inside of the ion-milling unit. Another problem is that, conductive particles tend to cause short-circuits between lines.

In the ion-milling step, the metal particles of ion-milled platinum, gold and the like tend to re-adhere to the lower portion and side surface of the lines. Thus, the lines are problem.

The first and second problems become serious as the integrating degree of integrated circuits rises.

The second problem can be solved by forming the openings of the photoresist film 6 in such a manner that the bottom area of each opening is larger than the top area thereof. Namely, each section of the gold plating film 7 is formed in a trapezoidal shape. This method is described in Japanese Patent Laid-Open Publication No. 63-292630. However, in this method, the sectional area of each gold line becomes small and thereby the resistance thereof increases. Thus, wider lines should be designed. Consequently, this method does not satisfy the requirement of fine line structure.

SUMMARY OF THE INVENTION

Therefore, an object of the present invention is to provide a gold line forming method that does not prevent fine line structure.

According to the present invention, there is provided a fabrication method for a semiconductor apparatus, comprising the steps of coating a first metal film that can be reactively ion-etched on the front surface of a base substrate, forming a second metal film containing platinum in a predetermined pattern by lift-off method, forming a resist film having at least one opening on the predetermined pattern and forming a gold plate film with the first metal film as a current supplying layer at the opening, and removing the resist film and removing the first metal film from a portion that is not coated with the gold plate film by the reactive ion-etching process so as to form gold lines.

A resist film with two openings formed at predetermined intervals is formed so as to form U-shaped gold lines.

A tungsten film or a titanium film is preferably coated as the first metal film. Magnetron discharge plasma etching process is performed with $SF_6$ gas or $CF_4$ gas or fluoride gasses.

Since the first metal film is removed by the reactive ion-etching process, at least part of a gas reactive product is easily exhausted outside the etching unit.

DETAILED DESCRIPTION OF THE PREFERRED EMBODIMENTS

First Embodiment

A first embodiment of the present invention will be described below.

Figure 1A:
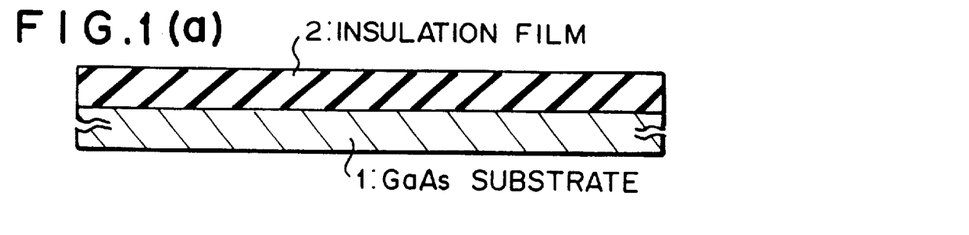
FIGS. 1(a) to 1(e) are sectional views showing fabrication steps (a) to (e) for explaining a first embodiment of the present invention.

The forming process steps of the first embodiment are preformed one after another as follows. Referring to FIG. 1(a), devices such as FETs (not shown) are formed inside or outside of a GaAs substrate 1. An insulation film 2 such as an $SiO_2$ film is formed on the GaAs substrate 1. Via-holes (not shown) that reach a wiring layer and an activation layer inside or outside of the GaAs substrate 1 are formed in the insulation film 2.

Figure 1B:
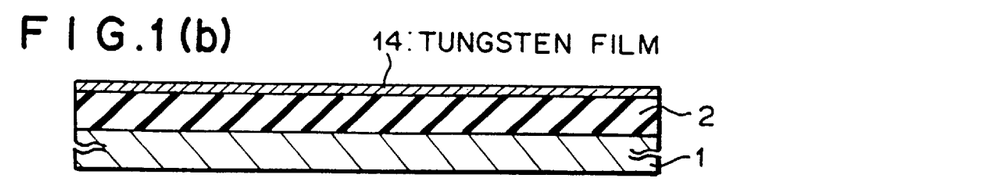
Figure 1C:
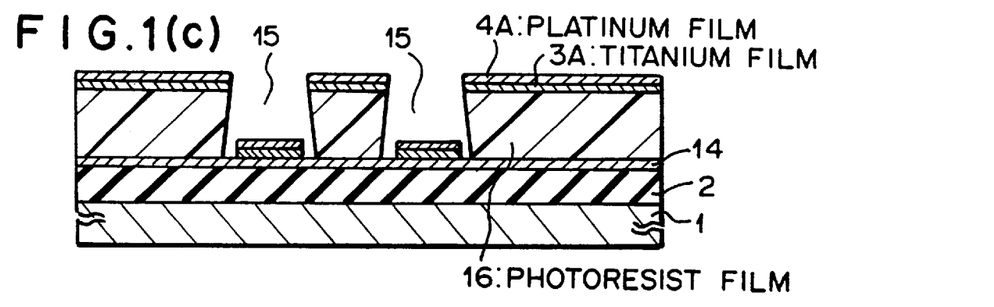

Next, as shown in FIG. 1(b), a tungsten film 14 with a thickness of 50 nm is formed on the insulation film 2 by sputtering process or the like. Thereafter, as shown in FIG. 1(c), a photoresist film 16 with openings 15 (the top area of each opening is smaller than the bottom area thereof) in a predetermined pattern is formed on the tungsten film 14.

Further, a titanium film 3A with a thickness of 100 nm and a platinum film 4A with a thickness of 50 nm are formed on the tungsten film 14 inside of the openings 15 and on the photoresist film 16 by electron beam evaporating process. These films are not deposited on the side surface of each opening of the photoresist film 16 (since the side surface is inclined). Thereafter, the photoresist film 16 is peeled off.

Figure 1D:
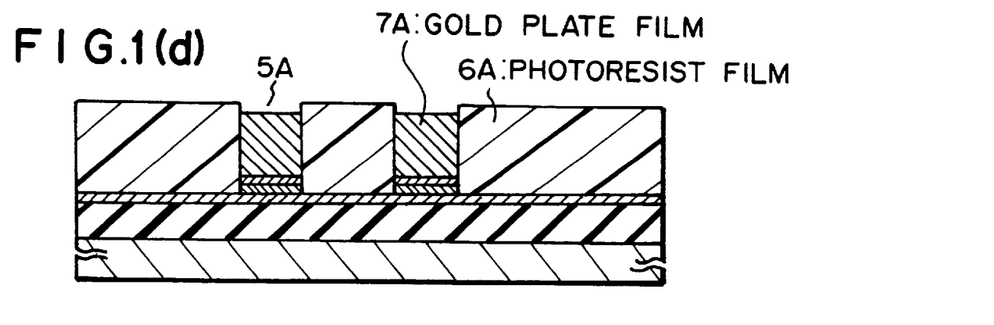

Thus, two-layered films of the platinum film 4A and the titanium film 3A can be selectively formed on the tungsten film 14. Furthermore, as shown in FIG. 1(d), a photoresist film 6A that has openings 5A and that has a thickness of for example 13 μm is formed onto the tungsten film 14 and on the remaining portions of the two-layered film. The position of each opening 5A preferably accords with the position of the two-layered films.

However, the position of each openings 5A may slightly deviate from the position of the two-layered films. With the tungsten film 14 as a current supplying layer, a gold plate film 7A with a thickness of 1 μm is formed on the two-layered films. Thereafter, the photoresist film 6A is removed thereby exposing portions of the tungsten film.

Figure 1E:
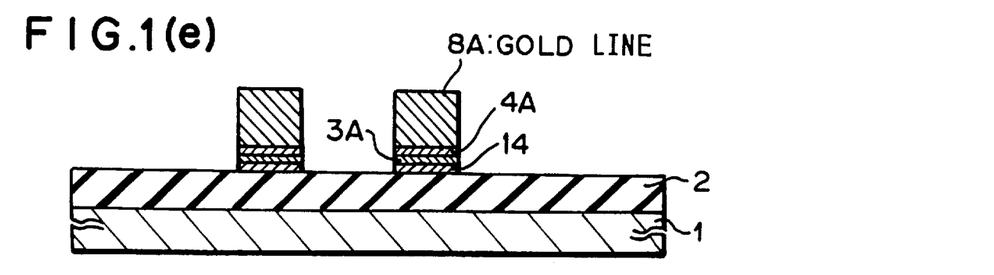

Film the exposed portions of the tungsten film 14 are then etched by the magnetron discharge plasma etching process (reactive ion-etching process) with $SF_6$ or $CF_4$ gas of fluoride gas. Thus, as shown in FIG. 1(e), gold lines 8A are formed on the tungsten film 14, the titanium film 3A and the platinum film 4A.

With a fluoride gas, the reactive product becomes a fluoride, which has a high vapor pressure that does not tend to adhere inside the etching unit and thereby easily exhausts outside the unit. Thus, the etching reaction chamber is hardly contaminated. In addition, the gold lines are hardly short-circuited by the particles. Moreover, the reactive product in the etching process has less affinity to re-adhere to lines than that of the ion-milling method.

Thus, the gold lines 8A are designed to have a rectangular sectional shape. The gold lines 8A may be formed in a reversely trapezoidal shape or a trapezoidal shape due to fluctuations in fabrication. Even if the gold lines 8A are formed in the reversely trapezoidal shape, reactive products hardly re-adhere to the gold lines 8A. In addition, even if the sectional shape of the gold lines 8A is formed in the rectangular shape, the decrease of the sectional area of each line is smaller than that in the case where gold lines 8A are designed to have the trapezoidal shape.

Second Embodiment

Next, a second embodiment of the present invention will be described.

Figure 2A:
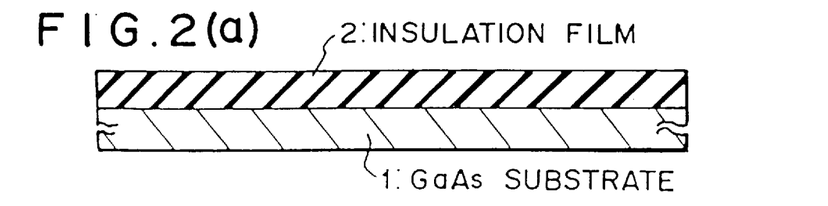
FIGS. 2(a) to 2(e) are sectional views showing fabrication steps (a) to (e) for explaining a second embodiment of the present invention.

The forming process steps of the second embodiment are preformed one after another as follows. As shown in FIG. 2(a), devices such as FETs (not shown) are formed inside of and over a GaAs substrate 1. An insulation film 2 such as a $SiO_2$ film with a thickness of about 1 μm is formed on the GaAs substrate 1. Via-holes that reach a wiring layer and an activation layer under the insulation film 2 are formed in the insulation film 2.

Figure 2B:
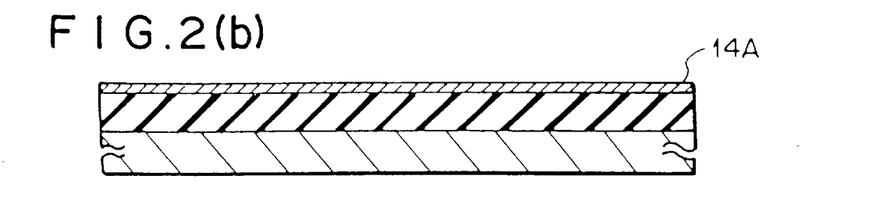
Figure 2C:
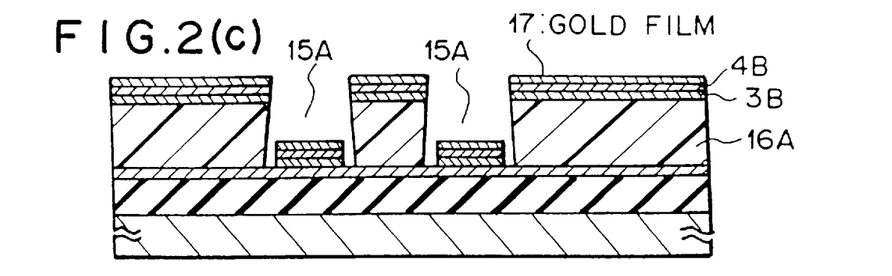

Next, as shown in FIG. 2(b), a tungsten film 14A with a thickness of 50 nm is formed on the insulation film 2 by the sputtering process or the like. As shown in FIG. 2(c), a photoresist film 16A with openings 15A which have a smaller top area than the bottom area thereof in a predetermined pattern is formed on the tungsten film 14A.

Thereafter, a titanium film 3B with a thickness of 100 nm, a platinum film 4B with a thickness of 50 nm, and a gold film 17 with a thickness of 200 nm are formed on the photoresist film 16A and on the tungsten film 14A of the openings 15A by the electron beam evaporating method. These films are not deposited on the side surface of each opening of a photoresist film 16A (since the side surface is inclined).

Figure 2D:
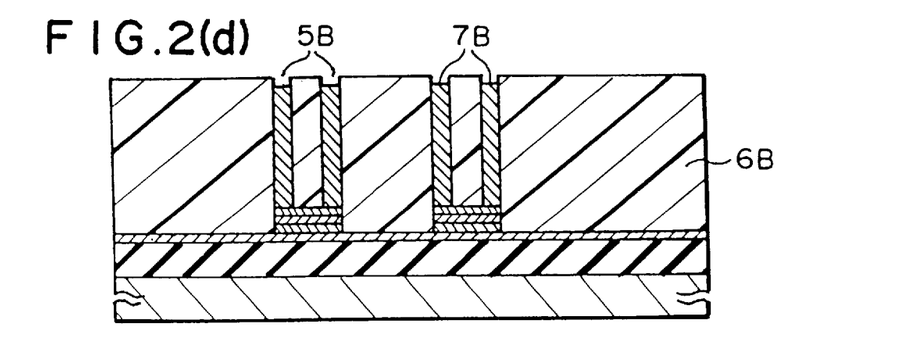

Next, the photoresist film 16A is peeled off. Thus, three-layered films of gold, platinum, and titanium can be selectively formed on the tungsten film 14A by the lift-off process. Next, as shown in FIG. 2(d), a photoresist film 6B that has two openings 5B on the three-layered films (in reality, the openings 5B are formed in parallel at predetermined intervals) and that has a thickness of 10 μm is formed on the tungsten film 14A and between the openings 5B. The photoresist film 6B is aligned so that at least part of the bottom portions of the two openings 5B are disposed on the three-layered films. The tungsten film 14A is gold-plated as a current supplying layer.

Figure 2E:
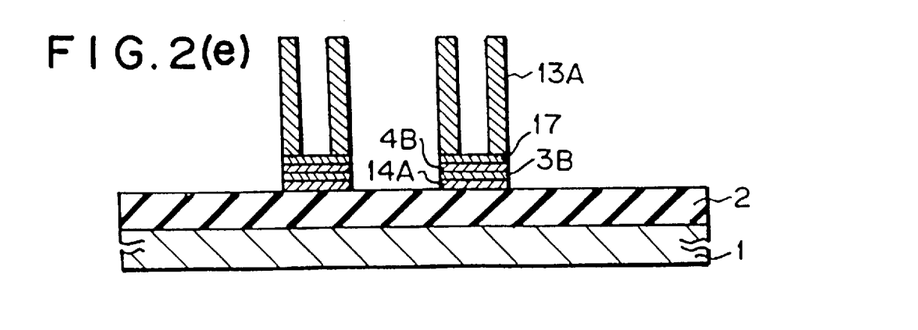

Thus, a gold plate film 7B with a height of 8 μm is formed on a gold film 17. The photoresist film 6B is removed by ashing process or the like. Those areas of the tungsten film 14A that are without the protection of the overlying three-layered film are etched by the magnetron discharge plasma etching process with $SF_6$ or $CF_4$ gas. Thus, as shown in FIG. 2(e), gold lines 13A with a U-shaped section on the three-layered film are obtained.

According to the second embodiment, the ion-milling process is not used. Thus, as with the first embodiment, short-circuit defect due to particles and re-adhered substance hardly takes place. In the second prior art reference, since the current supplying layer 10 is formed by the evaporating process or sputtering process, the step coverage is not high.

Thus, lines often break. To prevent such a problem, the countermeasures that the thickness of the current supplying layer 10 is increased or the side surface of the photoresist film is inclined are required. In the former, the thickness of the gold plate film 11 relatively decreases and thereby the resistance of the lines increases. In the latter, the top of each U-shaped gold line 13 widens (equivalent to the reversely trapezoidal shape in the first prior art reference).

Thus, the distance between the lines cannot be decreased. Consequently, the L/S (line and space) of lines is conventionally at most 5 $\mu$m/$\mu$m. However, according to the second embodiment, the L/S becomes 2 $\mu$m/3 $\mu$m.

Third Embodiment

Next, a third embodiment of the present invention will be described.

Figure 3A:
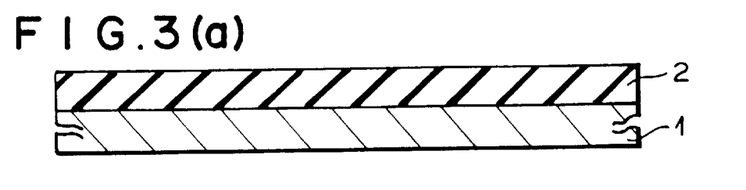
FIGS. 3(a) to 3(e) are sectional views showing fabrication steps (a) to (e) for explaining a third embodiment of the present invention.

The forming process steps of the third embodiment are preformed one after another as follows. As shown in FIG. 3(a), devices such as FETs, (not shown) are formed inside of or over a GaAs substrate 1. An insulation film 2 such as a $SiO_2$ film with a thickness of 1 $\mu$m is formed on the GaAs substrate 1. Via-holes(not shown) that reach a wiring layer and an activation layer inside of or over the GaAs substrate 1 are formed in the insulation film 2.

Figure 3B:
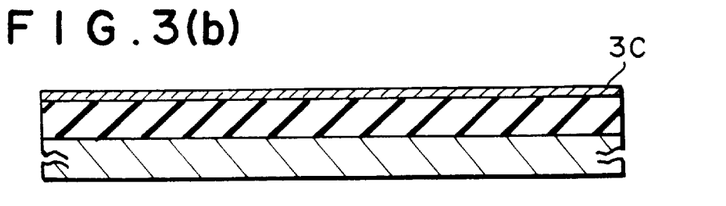
Figure 3C:
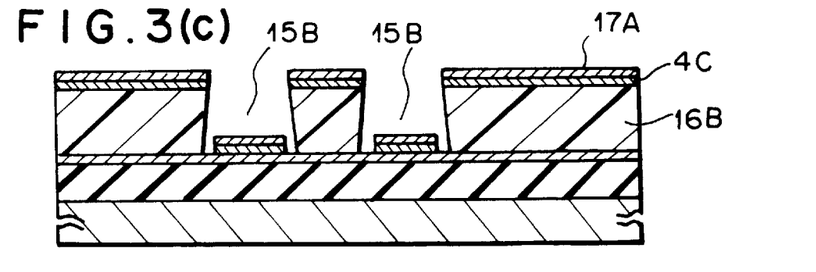

Next, as shown in FIG. 3(b), a titanium film 3C with a thickness of 100 nm is formed on the insulation film 2 by the sputtering process or the like. Thereafter, as shown in FIG. 3(c), a photoresist film 16B with openings 15B which have smaller top area than the bottom area thereof in a predetermined pattern are formed on the titanium film 3C. Further, a platinum film 4C with a thickness of 50 nm and a gold film 17A with a thickness of 200 nm are formed on the photoresist film 16B and on the titanium film 3C inside of the openings 15B by the electron beam evaporating method. These films are not deposited on the side surface of each opening of the photoresist film 16B (since the side surface is inclined).

Thus, the photoresist film 16B and the platinum film 4C and the gold film 17A on the photoresist film 16B are peeled off. Two-layered films of the gold film 17A and the platinum film 4C can be selectively formed on the titanium film 3C by the lift-off process.

Figure 3D:
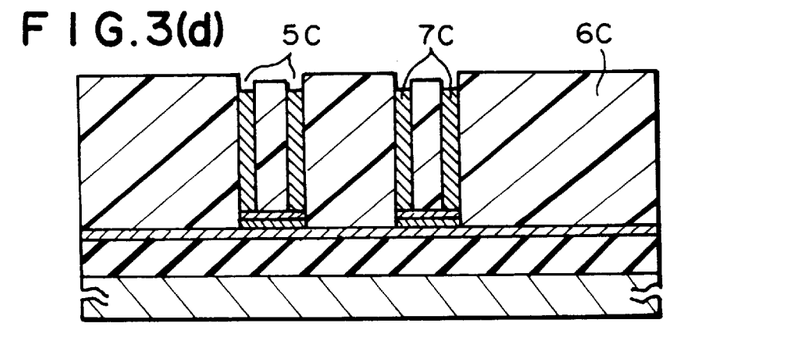

Next, as shown in FIG. 3(d), a photoresist film 6C that has two openings 5C in the two-layered films (in reality, the openings 5C are formed in parallel at predetermined intervals) and that have a thickness of 10 $\mu$m is formed on the titanium film 3C. The photoresist film 6C is aligned by a photolithography method or the like so that at least a part of the bottom portions of the two openings 5C is disposed on the two-layered films. The titanium film 3C is gold-plated as a current supplying layer.

Figure 3E:
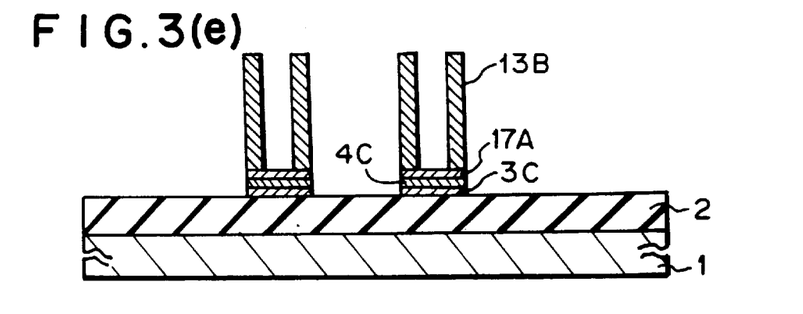

Thus, a gold plate film 7C with a height of 8 $\mu$m is formed on a gold film 17A. Thereafter, the photoresist film 6C is removed by the ashing process or the like. The titanium film 3C without the two-layered film area is etched by the magnetron discharge plasma etching process with $SF_6$ or $CF_4$ gas of fluoride gasses. Thus, as shown in FIG. 3(e), gold lines 13B with a U-shaped section are obtained on the insulation film 2 with the via-holes. Therefore, the gold lines 13B can conduct to electrodes of the FET or the like inside or over the substrate 1.

The third embodiment has the same effect as the second embodiment. In addition, since the titanium film that is a part of the barrier film that prevents gold from diffusing is used as a current supplying layer, the electron beam evaporating process can be performed in a short time.

In the first embodiment, a titanium film can be formed instead of the tungsten film 14. In addition, a platinum film can be formed instead of the two-layered films of platinum and titanium.

In the above-described embodiments, the case that the first metal film is a tungsten film or a titanium film was explained. However, the first metal film is not limited to such films. Instead, any metal film that is removed by the reactive ion-etching process and that can be used for a semiconductor apparatus can be used.

In addition, the first metal film may be a multi-layered film instead of a single-layered film. As the second metal film, in the above-described embodiments, two-layered films of platinum and titanium, two-layered films of gold and platinum, and three-layered films of gold, platinum, and titanium were explained. However, according to the present invention, the second metal film may be any film that contains platinum that is easily reactively ion-etched.

In the above-described embodiments, as the reactive ion-etching process, the magnetron reactive ion-etching process was used. However, it should be noted that anode coupled parallel plate reactive ion-etching process, cathode coupled parallel plate reactive ion-etching process, triode reactive ion-etching process, or type reactive ion-etching process may be used.

As described above, according to the present invention, with a metal film that can be removed by the reactive ion-etching process, a gold plate film is selectively formed as a current supplying layer. The current supplying layer is etched by reactive ions so as to form gold wires.

Thus, unlike with the ion-milling process, particles and re-adhered substance do not cause lines to short-circuit. In addition, since the side surface of each line is formed nearly perpendicular to the surface of the substrate. When the openings are inclined, they do not restrict the fine line structure. Thus, the present invention contributes to fine and dense structure of a semiconductor apparatus.

Although the present invention has been shown and described with respect to best mode embodiments thereof, it should be understood by those skilled in the art that the foregoing and various other changes, omissions, and addition in the form and detail thereof may be made therein without departing from the spirit and scope of the present invention.

What is claimed is:

1. A fabrication method for a semiconductor device, comprising the steps of:

coating a first metal film that can be reactively ion-etched on the front surface of a base substrate;

forming a second metal film containing platinum in a predetermined pattern by lift-off method;

forming a resist film having two openings formed at predetermined intervals and forming a gold plate film with the first metal film as a current supplying layer at the openings; and removing the resist film and removing the first metal film from a portion that is not coated with the gold plate film by the reactive ion-etching process so as to form U-shaped gold lines.

2. The fabrication method for the semiconductor device as set forth in claim 1, wherein a tungsten film is coated as the first metal film, and wherein magnetron discharge plasma etching process is performed with fluoride gas.

3. The fabrication method for the semiconductor device as set forth in claim 2, wherein magnetron discharge plasma etching process is performed with $SF_6$ gas.

4. The fabrication method for the semiconductor device as set forth in claim 2, wherein magnetron discharge plasma etching process is performed with $CF_4$ gas.

5. The fabrication method for the semiconductor device as set forth in claim 1, wherein a titanium film is coated as the first metal film, and wherein magnetron discharge plasma etching process is performed with fluoride gas.

6. A fabrication method for a semiconductor device, comprising the steps of:

forming a device in a substrate;

forming an insulation film on the substrate;

forming via-holes which reach a wiring layer and an activation layer in the substrate in the insulation film;

forming a tungsten film on the insulation film by a sputtering process;

forming a photoresist film with openings in a predetermined pattern on the tungsten film, wherein the openings are tapered such that the top area is smaller than the bottom area;

forming a titanium film and a platinum film on the tungsten film inside of the openings and on the photoresist film by an electron beam evaporating process;

peeling off the photoresist film selectively to form two-layered films of the platinum film and the titanium film on the tungsten film;

forming a second photoresist film which has second openings onto the tungsten film and on other portions of the two-layered films;

forming a gold plate film with the tungsten film as a current supplying layer on the two-layered films;

removing the second photoresist film and the tungsten film under the second photoresist film by an etching process.

7. The fabrication method for the semiconductor device as set forth in claim 6, wherein the etching process is a reactive ion-etching process.

8. The fabrication method for the semiconductor device as set forth in claim 6, wherein the etching process is a magnetron discharge plasma etching process.

* * * * *

UNITED STATES PATENT AND TRADEMARK OFFICE
CERTIFICATE OF CORRECTION

PATENT NO.: 6,022,803
DATED: February 8, 2000
INVENTOR(S): Kiyoshi TAKAHASHI

It is certified that error(s) appears in the above-identified patent and that said Letters Patent is hereby corrected as shown below:

Column 2, line 18, before "problem" insert --short-circuited and a wiring defect results. This is a second--.

Column 3, line 53, delete "Film the" and insert therefor --The--.

Signed and Sealed this

Twenty-seventh Day of March, 2001

*Attest:*

NICHOLAS P. GODICI

*Attesting Officer*

Acting Director of the United States Patent and Trademark Office